PHOTOSENSITIVE DEVICES HAVING LARGE AREA LIGHT ABSORBING JUNCTIONS

Filed Aug. 23, 1965

INVENTOR
Jearld L. Hutson

BY Thomas A. Harwood

ATTORNEY

United States Patent Office 3,418,545
Patented Dec. 24, 1968

3,418,545

PHOTOSENSITIVE DEVICES HAVING LARGE AREA LIGHT ABSORBING JUNCTIONS

Jearld L. Hutson, 907 Newberry,
Richardson, Tex. 75080

Filed Aug. 23, 1965, Ser. No. 481,814
11 Claims. (Cl. 317—235)

ABSTRACT OF THE DISCLOSURE

A photosensitive semiconductor device in which all of the terminals are connected to the rear surface of the device opposite the light absorbing surface is described. The device comprises two rectifying junctions to provide a photosensitive transistor function, and in one embodiment, employs another transistor sharing a common collector with the photosensitive device to amplify the output of the latter. In a yet further embodiment, two or more photosensitive devices are connected in the equivalent of a parallel configuration the outputs of which are amplified by another transistor, all of which are incorporated in a single wafer and using a common collector.

Semiconductor diodes and transistors are frequently used as photosensitive detectors to produce an electrical output in response to optical radiation incident thereon. The use of such devices for this purpose is quite commonly known, wherein light absorbed adjacent one or more of the junctions of the device causes the migration of holes and electrons across the junction to produce an electrical signal at the output. Regardless of the particular application of such a device, and whether or not it is used in conjunction with a particular light source or natural light, it is usually advantageous that the device have a large area light photon absorbing junction and an equally large surface area through which the light photons pass to be absorbed by the junction. The latter implies a large surface area which is unobstructed to the passage of light therethrough.

There are several problems that still exist in the manufacture of photosensitive devices, such as phototransistors, for example, to be used for the above-stated purpose. As one example, the terminals or leads of a transistor are conventionally made to both sides of the semiconductor wafer. However, it is undesirable to have an electrical connection made to the light incident surface of the transistor used for this purpose since the electrical connection reduces, to some extent, the amount of surface area effective for absorbing light. Moreover, it is difficult to mount a device of this type in close proximity to a light source because of the disposition of the electrical terminal or lead between the two. Although some planar constructed devices have all the leads connected to a single surface of the semiconductor wafer, these devices are normally unsuitable as a photosensitive device when the unobstructed opposite surface of the wafer is used as the light absorbing surface. The reason for this lies in the fact that the leads are attached to the surface of the wafer through which the impurities are diffused to form the junctions therein, whereby it is very difficult, if not impossible, to diffuse these junctions close enough to the opposite surface with any accuracy so that light entering the opposite surface is not absorbed before it reaches junctions. This invention provides a photosensitive device in which there are no electrical terminals or leads made to the surface of the device through which the light or optical radiation is absorbed, while at the same time, provides all the other desirable features of a photosensitive device in that the junctions are disposed in close proximity to the unobstructed light absorbing surface. An additional advantage of this construction of the invention permits the use of an additional lead to the rear surface of the device so that it can be used to produce an output signal in response either to light incident thereon or to an electrical signal applied to the additional lead, thus providing the feature of logic.

In addition to the above problem, it is very difficult, if not virtually impossible, to manufacture a photosensitive mosaic incorporating a plurality of photosensitive devices within a single slice of semiconductor material. Using conventional techniques and designs, the provision of such a mosaic requires the connection of a multitude of leads or terminals to the surface of the mosaic through which light is absorbed, thus greatly reducing the effective light responsive area. By using a device constructed according to the invention, as noted above, the problem of leads or terminals on the light absorbing surface of a photosensitive mosaic is eliminated.

Still another problem, and one which is virtually insoluble using conventional manufacturing techniques, is the provision of a semiconductor mosaic containing a large number of individual photosensitive devices therewithin in which all of the devices meet the required specifications. That is to say, an attempt to manufacture a mosaic of this nature almost always results in one or several of the devices incorporated within the mosaic being faulty. This usually results in the loss of the entire mosaic for its intended purpose when one or more of the individual devices are bad.

To eliminate these problems, the invention provides a device having a structure in which all the leads are connected to the rear of the slice opposite the light absorbing surface and in which the device itself still has all the desirable photosensitive characteristics. When this structure is applied to a mosaic comprising a plurality of such devices, this improvement, as will be seen hereinafter, allows additional devices to be provided in the rear surface of the wafer to which the leads are attached to achieve greater versatility and more efficient use of the mosaic as a photosensitive device and detector. Moreover, this allows the utilization of a redundancy principle, wherein the outputs of a plurality of the photosensitive devices in the mosaic are connected to a single, additional device, such as a transistor, formed in the rear surface of the wafer so that in the event of a faulty photosensitive device, the mosaic is still operable.

The above-stated objects and features are carried out in one embodiment of the invention, in the case of a photosensitive transistor, by providing a diffused base region substantially coextensive with the entire surface of the device, front and back, so that an emitter region can be diffused into the base region at the rear surface of the wafer. As is commonly known to those skilled in this particular art, it is the base-collector junction within the vicinity of which the light should be absorbed to produce the desired signal at the output terminals. Thus in this embodiment, the base-collector junction is very near the top surface of the device or wafer and is substantially coextensive with this surface, while at the same time, the base region is extended to the back of the device for the provision of an emitter therein. By providing the emitter at the rear of the device, all electrical terminals can be attached to the surface opposite the light absorbing surface.

In another embodiment of the invention, the base region is also extended to the rear of the device for the provision or diffusion of an emitter therein, and a channel of relatively small area as compared to the total area of the wafer is provided which extends through the wafer connecting the base region at the top and bottom thereof. As will become apparent later, this allows the provision of a base region at the top surface with a relatively large area but permits the provision of a relatively small area base region at the rear surface. The advantage here is that other devices can be diffused in the rear surface of the wafer while utilizing the maximum surface area at the top of the wafer, all in addition to the fact that all of the terminals are attached to this rear surface. This construction, when applied to a mosaic of such device within a single wafer, as in another embodiment of the invention, permits the use of the redundancy principle noted above with all leads attached to the rear surface of the wafer.

Other objects, features and advantages of the invention will become apparent from the following detailed description thereof when taken in conjunction with the appended claims and the attached drawing wherein like reference numerals refer to like parts throughout the several figures, and in which:

Figure 2:
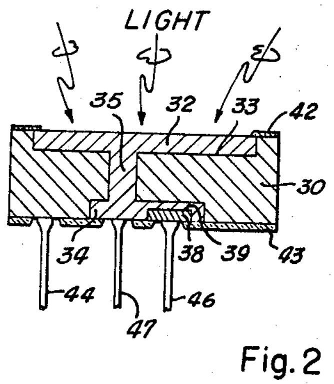
FIGURE 2 shows schematically a side elevational view in section of another embodiment of the invention.
Figures 3, 4:
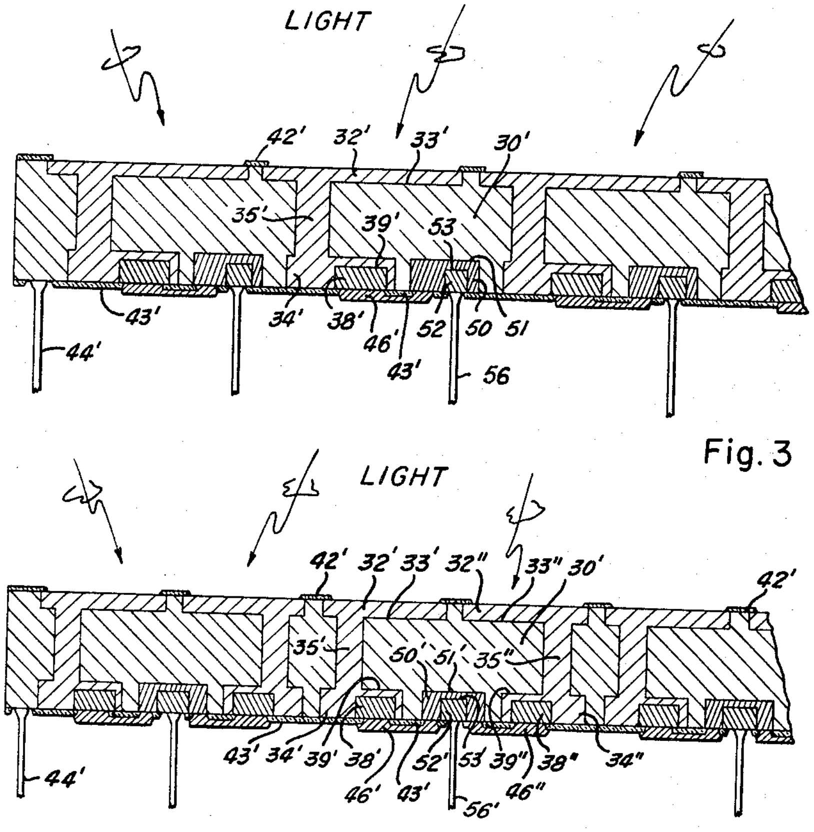

FIGURE 3 shows schematically a side elevational view in section of a mosaic of photosensitive transistors incorporated within a single wafer of semiconductor material using the construction shown in FIGURE 2, wherein other devices are formed in the rear surface of the wafer; and FIGURE 4 shows schematically a side elevational view in section of another mosaic using the construction shown in FIGURE 2, but which utilizes a redundancy of several photosensitive transistors to produce a single output.

Figure 1:
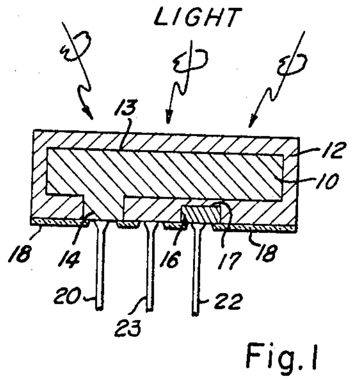
FIGURE 1 shows schematically a side elevational view in section of a photosensitive transistor according to one embodiment of the invention.

One embodiment of the invention is shown in FIGURE 1, which comprises a slice or wafer of semiconductor material 10 of a first electrical conductivity type into all surfaces and sides of which, with the exception of a small area on the bottom of the slice, there is diffused an impurity which determines an opposite conductivity type to form a region 12 of opposite conductivity type to that of wafer 10 separted from the original wafer by a rectifying junction 13. This particular embodiment of the invention is a transistor in which the base-collector junction is responsive to the absorption of optical radiation adjacent thereto to produce an electrical output signal between the collector and emitter terminals. As shown in the figure, the original wafer 10 is used as the collector of the transistor and region 12 as the base, with the depth of the junction 13 beneath the top surface of the wafer being controlled during the diffusion process so that a maximum amount of the light incident on the top surface, when absorbed, generates carriers which are collected at the junction 13. Conventional masking and diffusion techniques, well known to those skilled in the art, are used to form the diffused base region 12 and all other diffusions described hereinafter. It will be noted that a region 14 of the collector adjacent the bottom surface of the wafer is suitably masked against the base diffusion (an oxide mask, for example), to prevent the base region from also being formed in this region and completely encircling the collector of the transistor.

After the base region has been diffused, an impurity which determines the same conductivity type as that of the collector is diffused into a small area of the base region from the bottom surface of the wafer to provide an emitter region 16 separated from the base region by rectifying junction 17. Assuming the device is made of silicon, although any semiconductor material can be used, an oxide layer 18 is formed on the bottom surface of the wafer either during or after the emitter diffusion to cover the collector-base and base-emitter junctions which extend to the bottom surface, as is customarily done in diffused transistor technology to protect these junctions. Openings are left in the oxide layer, however, to expose parts of the surface of the emitter 16 and the surface of the collector 10 adjacent the small region 14, so that electrical terminals 20 and 22 can be attached to the collector and emitter regions, respectively.

The conventional diffusion and masking techniques used herein to achieve the device shown in FIGURE 1 will be readily apparent to those skilled in the art and will not be elaborated on here. Suffice it to say that when the base region is initially diffused into the collector wafer, the impurity penetrates all surfaces and sides of the wafer except that region 14 which is masked by a suitable oxide or other means. Thus the base region is coextensive with the entire top surface of the wafer and a large portion of the bottom surface of the wafer, and is also provided throughout the edges of the wafer to provide a continuous base region. The depth of the active junction, that being the base-collector junction at or near which the radiation incident on the wafer is to be absorbed, is controlled as noted before. Otherwise, light incident on the top surface will either be absorbed within the bulk of the device too far above the junction or will penetrate too deeply within the device before it is absorbed, thus causing little or no signal to be produced. The depth of junction 13 can be controlled very accurately in the device shown in FIGURE 1 and has the advantage that the entire top surface of the device is effective as a light absorbing surface for junction 13 without the obstruction of this surface with electrical contacts. This device has the application, among others, that it may be coupled very closely to a light emitting source without the interposition of an electrical lead therebetween.

As an example only, a wafer of thickness of between 4 and 10 mils is suitable, with the base-collector junction being formed at a depth of about 0.1 mil below the surface thereof. The emitter-base junction is then formed at about 0.05 mil from the bottom surface.

The device of FIGURE 1 produces an electrical output signal between collector terminal 20 and emitter terminal 22 in response to light incident on the top surface thereof. To provide a logic function, another lead 23 can be attached to the base region at the rear surface, which lead is optional and it is to be understood that the device can be used in either embodiment, with or without the lead. In this case, the device produces an electrical output signal between the collector and emitter terminals in response either to light or to an electrical signal applied to the additional lead 23.

Another embodiment of the invention is shown in FIGURE 2, which also utilizes the feature of a base region substantially coextensive with the entire top surface area of the device, but coextensive with only a portion of the bottom surface, wherein these two regions are connected to form a single continuous base region. A semiconductor slice or wafer 30 of a first conductivity type, also to be used as the collector of the transistor, is suitably masked on the top surface about the periphery thereof to leave exposed the major surface area and is also masked over the bottom surface thereof to leave exposed a smaller area beneath the larger exposed area on the top surface. A suitable impurity which determines the opposite conductivity type as that of the wafer is diffused into the top and bottom exposed surfaces to provide regions 32 and 34, respectively. Subsequent to this, the two regions are connected by forming a region 35 therebetween of the same conductivity type. The connecting region 35 can be formed by any one of several processes such as, for example, by masking both the top and bottom surfaces of the wafer with the exception of the surface areas opposite the ends of region 35 and carrying out another diffusion from both sides for a sufficient length of time to connect regions 32 and 34. A very suitable process for forming region 35 is the gradient zone melting process as developed by W. G. Pfann, wherein a suitable dot of metal or alloy which will alloy with the semiconductor wafer, such as gold in the case of silicon, is placed on the top or bottom of the wafer where the region 35 is to be formed and is alloyed to this surface. Thereafter, a temperature gradient is maintained between the two surfaces of the wafer, with the lower of the two temperature surfaces being that at which the dot is initially alloyed. This temperature gradient is maintained for a sufficient length of time so that the alloy penetrates the wafer, forming a regrowth region as it does so, between the two opposite regions 32 and 34. This process is familiar to those skilled in the art and will not be elaborated on here, wherein the details of this process can be found in the article entitled, "Temperature-Gradient Zone Melting" by W. G. Pfann, Journal of Metals, volume 7, p. 961, 1955.

After the two opposing regions have been connected to form a continuous base region which incorporates almost the entire top surface area of the wafer and a smaller area below, another impurity that determines the same type conductivity as the collector is diffused into the base region disposed at the bottom surface of the slice to form an emitter region 38 separated from the base region by junction 39. All of the oxide that is formed during the diffusion process is then removed from the top surface of the wafer except a narrow annular layer 42 about the periphery of the device which covers and protects the base junction extending to this surface. Another layer 43 of oxide is left on the bottom surface of the wafer, with the exception of one opening provided to expose the collector region and another opening provided to expose a surface of the emitter region. Electrical contacts 44 and 46 are then attached to the collector and emitter regions, respectively, at the locations where the oxide is removed. Again, an additional lead 47 (optional) can be provided to the base region for the same purpose noted in conjunction with the embodiment shown in FIGURE 1.

This device has the same advantage as does the device shown in FIGURE 1 insofar as the large unobstructed top surface area made available for the absorption of optical radiation, and the equally large area of the base disposed therebeneath at or near which the photons of light are absorbed. It also has the same advantage in that all electrical contacts are attached to the bottom surface of the wafer opposite the light absorbing surface. The device in FIGURE 2 has an additional advantage in that the particular construction is adapted to be used to provide a plurality of such devices within a single wafer of semiconductor material.

A plurality of devices incorporated within a single wafer of semiconductor material, hereinafter referred to as a mosaic, wherein each is constructed as shown in FIGURE 2, is shown in FIGURE 3, wherein a single unitary wafer of semiconductor material 30′ is used as the collector of the mosaic. Again, the wafer is suitably masked and diffused to form a plurality of large area base regions 32′ at the top of the wafer and an equal plurality of smaller base regions 34′ at the rear surface of the wafer disposed, respectively, beneath the top base regions and connected by intermediate regions 35′. The base regions are separated from the common collector 30′ by rectifying junctions 33′. Emitter regions 38′ are provided in the smaller base regions at the rear surface and are separated from the base regions by rectifying junctions 39′. Suitable oxide layers 42′ are provided over the top surface of the wafer to cover only the junctions where they intersect the surface. Similarly, an oxide layer 43′ is provided on the rear surface to cover the exposed junctions. A lead 44′ is attached to the collector region 30′ through a hole in the oxide, as shown.

One of the advantages of the individual device constructed as shown in FIGURES 2 and 3 is that several of such devices can be incorporated within a single wafer of semiconductor material, utilizing a common collector region, with all leads attached to the rear surface thereof, all as will be evident from FIGURE 3. Another advantage is that the region of the base adjacent the rear surface of the wafer need not cover nearly as large an area as the top region thereof, but is just sufficient for the diffusion of an emitter region therein. Thus a considerable amount of area at the rear surface of the wafer is made available for the incorporation therein of other devices. The provision of additional devices in the rear surface of the wafer is shown in FIGURE 3, wherein other transistors, used for amplifying the signal produced by the photosensitive transistor, are diffused into the rear surface of the wafer adjacent the smaller base regions 34′, respectively. To do this, an impurity that determines the same conductivity type as the base is diffused into this surface to form separate base regions 50 separated from the collector region or wafer 30′ by rectifying junctions 51, and subsequently, an impurity which determines the same conductivity type as the collector region is diffused into the separate base regions to form emitter regions 52 separated from these base regions 50, respectively, by rectifying junctions 53. It will be noted that these additional transistors utilize the same common collector region 30′. The outputs of the photosensitive transistors are then connected to the inputs of their respective amplifying transistors, whereby to accomplish this, suitable contacts 46′ are made between the emitters of the photosensitive transistors and the bases of the amplifying transistors. As one example, and as shown in FIGURE 3, metal contacts 46′ are evaporated onto the rear of the wafer into an opening exposing part of the surface of the emitter regions 38′ and an opening exposing a part of the base regions 50 of the amplifying transistors, thus connecting the two, with oxide layers 43′ covering the various exposed junctions of the transistors to prevent shorting and to protect this junction. The output of the mosaic is then taken between the collector lead 44′ and emitter leads 56 connected to the emitters of the amplifying transistors.

The several features and advantages of the invention as applied to the mosaic structure shown in FIGURE 3 will now become apparent when it can been seen that virtually the entire top surface area of the mosaic is effective for absorbing light, and further, that the total base-collector junction area is substantially coextensive with the light absorbing surface. Thus a very large effective junction area is provided. Moreover, all the leads are attached to the rear surface of the wafer as noted earlier. In addition, there is adequate space at the rear surface of the mosaic for the provision therein of additional devices, such as the amplifying transistors shown. It will be apparent that the relative dimensions of the mosaic and devices as described herein are not to scale and that the smaller region 34′ of the base can be made much, much smaller than the larger region 32′ thereof, so that virtually the entire rear surface area of the mosaic is made available for the incorporation therein of other devices.

Another mosaic device incorporating the same photosensitive transistor structure is shown in FIGURE 4, wherein there is additionally provided a duplication of the photosensitive transistors to utilize a redundancy principle. In FIGURE 4 like reference numerals refer to like parts as described in FIGURE 3, but in addition, there is provided an additional photosensitive transistor for each amplifying transistor provided at the rear surface of the wafer. For example, another photosensitive transistor including a large area base region 32″ along the top surface of the wafer and a smaller region 34″ at the bottom surface, connected by the intermediate region 35″, is formed adjacent another identical photosensitive transistor having the same reference numerals as that shown in FIGURE 3. Here, the various parts of the additional photosensitive transistor correspond to like parts of the already described transistor with a double prime notation. Similarly, the amplifying transistor formed between the two photosensitive transistors corresponds in numerals to the amplifying transistor shown in FIGURE 3, but with the numerals having prime notations. Again, a metallic contact 46′ is evaporated onto the rear of the wafer to connect the emitter region 38' of one of the photosensitive transistors to the base region 50' of the amplifying transistor. Similarly, another contact 46'' is evaporated onto the wafer to connect the emitter region 38'' of the additional photosensitive transistor to the same base region 50' of the amplifying transistor.

It will be apparent from the mosaic shown in FIGURE 4 that if either of the two photosensitive transistors connected to the amplifying transistor produces an output between the emitter thereof and the collector terminal 44', the amplifying transistor will generate a signal between its emitter connection 56' and the collector terminal 44'. The mosaic structure of FIGURE 4 shows, for purposes of example only, two photosensitive transistors connected to a single amplifying transistor, with several of these combinations being formed within the mosaic. It will become apparent that more than two photosensitive transistors can be connected at their outputs to a single amplifying transistor, wherein this particular construction illustrates the redundancy principle. Thus during the manufacture of the mosaic, it is possible to have faulty devices without the loss of a signal from any of the amplifying transistors. This results from the fact that there is more than one photosensitive device connected to each amplifying transistor, and that upon failure of one of them, the other will produce the necessary signal. Moreover, it is unlikely that all of the photosensitive transistors connected to any one amplifying transistor will be faulty during the manufacture thereof. In the event that two or more of the photosensitive transistors connected to the base of a single amplifying transistor produce a driving signal for the amplifying transistor, the terminal of the amplifying transistor can be connected to any suitable electrical leveling means (not shown) so that the outputs from all of the amplifying transistors will be the same.

Additional base leads can also be applied to the individual transistors within the mosaic structures shown in FIGURES 3 and 4 if so desired, so that the mosaic can be provided with the more versatile logic functions, all as described earlier.

Other modifications and substitutions, which do not depart from the true scope of the invention, in addition to those described, will undoubtedly occur to those skilled in the art, even though the foregoing description refers to specific embodiments of the invention. Thus it is intended that the invention be limited only as defined in the appended claims.

What is claimed is:

1. A semiconductor device comprising:

(a) a semiconductor body of one electrical conductivity type having first and second major opposing surfaces, (b) a first region of opposite electrical conductivity type comprising a first part defined in and including substantially all of said first surface, a second part defined in and including a portion of said second surface and a third part connecting said first and said second parts, (c) a second region of said one electrical conductivity type defined within said second part of said first region and including some of said portion of said second surface, and (d) first and second electrode means attached to said body at said sceond surface spaced from said second part of said first region and to said second region at said second surface, respectively.

2. A semiconductor device according to claim 1 wherein said third part of said first region is defined in and includes a surface of said body along the side thereof.

3. A semiconductor device accordance to claim 1 wherein said third part of said first region defines a channel within the interior of said body connecting said first and said second parts of said first region.

4. A semiconductor device according to claim 1 including third electrode means attached to said second part of said first region at said second surface.

5. A semiconductor device comprising:

(a) a semiconductor body of one electrical conductivity type having first and second major opposing surfaces, (b) a first region of opposite electrical conductivity type comprising a first part thereof defined in and including substantially all of said first surface, a second part thereof defined in and including a first portion of second surface and a third part thereof connecting said first and said second parts, (c) a second region of said one electrical conductivity type defined within said second part of said first region and including some of said first portion of said second surface, (d) a third region of said opposite electrical conductivity type defined in and including a second portion of said second surface spaced from said second part of said first region, (e) a fourth region of said one electrical conductivity type defined within said third region and including some of said second portion of said second surface, (f) a first electrode connecting said second region and said third region, (g) a second electrode attached to said body of said one electrical conductivity type at said second surface, and (h) a third electrode attached to said fourth region.

6. A semiconductor device for producing an electrical output signal responsive to optical radiation incident thereon, comprising:

(a) a semiconductor body of one electrical conductivity type having first and second major opposing surfaces, (b) a first region of opposite electrical conductivity type comprising:

(1) a first part defined in and including substantially all of said first surface and forming a rectifying junction with said body beneath said first surface at a depth which will collect carriers generated by the absorption of optical radiation by said body passing through said first surface, (2) a second part defined in and including a portion of said second surface, and (3) a third part connecting said first and said second parts, (c) a second region of said one electrical conductivity type defined within said second part of said first region and including some of said portion of said second surface, and (d) first and second electrode means attached to said body at said second surface spaced from said second part of said first region and to said second region at said second surface, respectively.

7. A semiconductor device comprising:

(a) a semiconductor body of one electrical conductivity type having first and second major opposing surfaces, (b) a plurality of first regions of opposite electrical conductivity type, each comprising a first part defined in and including a portion of said first surface, a second part defined in and including a portion of said second surface and a third part connecting said first and said second parts, (c) a plurality of second regions of said one electrical conductivity type defined within said second parts, respectively, of said plurality of first regions and each including some of said portions of said second surface, respectively, (d) a first electrode attached to said body at said second surface spaced from said second parts of said plurality of first regions, and (e) a plurality of second electrodes attached to said plurality of second regions, respectively, at said second surfaces.

8. A semiconductor device according to claim 7 wherein said plurality of third parts of said plurality of first regions, respectively, each defines a channel within the interior of said body.

9. A semiconductor device comprising:

(a) a semiconductor body of one electrical conductivity type having first and second major opposing surfaces, (b) a plurality of first regions of opposite electrical conductivity type, each comprising a first part defined in and including a portion of said first surface, a second part defined in and including a portion of said second surface and a third part connecting said first and said second parts, (c) a plurality of second regions of said one electrical conductivity type defined within said second parts, respectively, of said plurality of first regions and each including some of said portions of said second surfaces, respectively, (d) a plurality of third regions of said opposite electrical conductivity type, each defined in and including other portions of said second surface spaced from said plurality of sceond parts of said plurality of first regions, (e) a plurality of fourth regions of said one electrical conductivity type defined within said plurality of third regions, respectively, each including some of said other portions, respectively, of said second surface, (f) a plurality of first electrodes connecting said plurality of said second regions with said plurality of third regions, respectively, (g) a second electrode attached to said body at said second surface spaced from said plurality of second parts of said first regions and said plurality of third regions, and (h) a plurality of third electrodes attached to said plurality of fourth regions, respectively.

10. A semiconductor device comprising:

(a) a semiconductor body of one electrical conductivity type having first and second major opposing surfaces, (b) a plurality of first regions of opposite electrical conductivity type, each comprising a first part defined in and including a separate portion of said first surface, a second part defined in and including a separate portion of said second surface and a third part connecting said first and said second parts, wherein the total of said separate portions of said first surface is substantially equal to the total area of said first surface, (c) a plurality of second regions of said one electrical conductivity type defined within said second parts, respectively, of said plurality of first regions and each including some of said portions of said second surface, respectively, (d) a first electrode attached to said body at said second surface spaced from said second parts of said plurality of first regions, and (e) a plurality of second electrodes attached to said plurality of second regions, respectively at said second surfaces.

11. A semiconductor device comprising:

(a) a semiconductor body of one electrical conductivity type having first and second major opposing surfaces, (b) a plurality of first regions of opposite electrical conductivity type, each comprising a first part defined in and including a portion of said first surface, a second part defined in and including a portion of said second surface and a third part connecting said first and said second parts, (c) a plurality of second regions of said one electrical conductivity type defined within said second parts, respectively, of said plurality of first regions and each including some of said portions of said second surface, respectively, (d) a plurality of third regions of said opposite electrical conductivity type, each defined in and including other portions of said second surface spaced from said plurality of second parts of said plurality of first regions, (e) a plurality of fourth regions of said one electrical conductivity type defined within said plurality of third regions, respectively, each including some of said other portions, respectively, of said second surface, (f) a plurality of first electrodes connecting each of said third regions with a separate plurality of said second regions, respectively, (g) a second electrode attached to said body at said second surface spaced from said plurality of second parts of said first regions and said plurality of third regions, and (h) a plurality of third electrodes attached to said plurality of fourth regions, respectively.

References Cited

UNITED STATES PATENTS

| | | | |
|---|---|---|---|
| 2,780,765 | 2/1957 | Chapin et al. | |
| 3,175,929 | 3/1965 | Kleinman | 136—89 |
| 3,187,193 | 6/1965 | Rappaport et al. | 307—88.5 |
| 3,250,968 | 5/1966 | Jochems et al. | 317—235 |
| 3,255,047 | 6/1966 | Escoffery | 136—89 |
| 3,261,074 | 7/1966 | Beauzee | 29—25.3 |
| 3,350,775 | 11/1967 | Iles | 29—572 |

JOHN W. HUCKERT, *Primary Examiner.*

R. F. POLISSACK, *Assistant Examiner.*

U.S. Cl. X.R.

317—234; 307—308, 311